United States Patent
Tarui et al.

[11] Patent Number: 5,920,143
[45] Date of Patent: Jul. 6, 1999

[54] SURFACE ACOUSTIC WAVE DEVICE

[75] Inventors: Hisaki Tarui, Sijyounawate; Keiichi Kuramoto, Kadoma; Hitoshi Hirano, Nishinomiya; Yoichi Domoto, Hirakata, all of Japan

[73] Assignee: Sanyo Electric Co. Ltd., Osaka, Japan

[21] Appl. No.: 08/893,091

[22] Filed: Jul. 15, 1997

[30]     Foreign Application Priority Data

Jul. 18, 1996  [JP]  Japan .................................. 8-189236
Mar. 4, 1997   [JP]  Japan .................................. 9-049387
Jun. 27, 1997  [JP]  Japan .................................. 9-171780

[51] Int. Cl.$^6$ .................................................. H01L 41/08
[52] U.S. Cl. ........................................................ 310/313 A
[58] Field of Search .......................... 310/313 R, 313 A, 310/313 B; 333/150–153, 190–196

[56]             References Cited

U.S. PATENT DOCUMENTS

| | | | |
|---|---|---|---|
| 4,511,816 | 4/1985 | Mikoshiba et al. ................. | 310/313 A |
| 4,567,393 | 1/1986 | Asai et al. .......................... | 310/313 A |
| 4,571,519 | 2/1986 | Kawabata et al. .................. | 310/313 A |
| 4,952,832 | 8/1990 | Imai et al. .......................... | 310/313 A |
| 5,235,233 | 8/1993 | Yamamoto .......................... | 310/313 A |
| 5,329,208 | 7/1994 | Imai et al. .......................... | 310/313 R |
| 5,446,329 | 8/1995 | Nakahata et al. ................... | 310/313 A |
| 5,565,724 | 10/1996 | Hachigo et al. ................... | 310/313 A |
| 5,576,589 | 11/1996 | Dreifus et al. ..................... | 310/313 A |

FOREIGN PATENT DOCUMENTS

| | | | |
|---|---|---|---|
| 0 363 495 | 4/1990 | European Pat. Off. . | |
| 0517239 | 12/1992 | European Pat. Off. ........... | 310/313 A |
| 0 608 864 | 8/1994 | European Pat. Off. . | |
| 0 674 386 | 9/1995 | European Pat. Off. . | |
| 3422108 | 12/1984 | Germany .......................... | 310/313 A |
| 2239715 | 9/1990 | Japan ................................ | 310/313 A |
| 5090893 | 4/1993 | Japan ................................ | 310/313 A |

*Primary Examiner*—Mark O. Budd
*Attorney, Agent, or Firm*—Nikaido Marmelstein Murray & Oram, LLP

[57]             ABSTRACT

A surface acoustic wave device is disclosed which includes a piezoelectric substrate upon which a surface wave propagation film, which is comprised of a diamond-like carbon or aluminum nitride film, is provided.

46 Claims, 12 Drawing Sheets

SURFACE ACOUSTIC WAVE DEVICE

BACKGROUND OF THE INVENTION

1. Field of the Invention

The present invention relates to a surface acoustic wave device.

2. Description of Related Art

Surface acoustic wave devices have been widely used such as for filters in communication and other fields. They find a particular use in a mobile radio communication field for their simple constructions effective in providing satisfactory characteristics. In such a mobile radio communication field, an increasing demand has arisen for their operations at higher frequencies with recent increase in information contents. Consequently, the surface acoustic wave devices have been mostly operated in the UHF range.

One method of achieving high frequency operations of the surface acoustic wave devices is to improve electrode constructions such that an electrode period thereof can be reduced. Another method contemplates to laminate upon a piezoelectric substrate a surface wave propagation film which allows high-speed propagation of acoustic waves.

Japanese Patent Laying-Open No. Hei 1-17795 (1989) discloses a diamond thin film for use as the surface wave propagation film which allows high-speed propagation of acoustic waves.

However, if such a diamond thin film is to be formed, a substrate needs to be heated generally to 800–900° C. This causes a high degree of heat stress in the laminate to disadvantageously result in poor adherence thereof to an underlying layer.

Also, the high temperature film-forming accompanies complicated fabrication processes. The influence of heat upon the underlying layer including the substrate must be taken into consideration. This, for example, makes it difficult to form the diamond thin film subsequently to the formation of electrodes such as of aluminum.

SUMMARY OF THE INVENTION

It is an object of the present invention to provide a surface acoustic wave device in which a surface wave propagation film showing good adherence to an underlying layer can be formed without the necessity of high-temperature film forming process, and which has an improved corrosion resistance and is operable at high frequencies.

In accordance with a first aspect of the present invention, a surface acoustic wave device is provided which includes a piezoelectric substrate, a surface wave propagation film disposed upon the piezoelectric substrate and electrodes for applying an electric field in the piezoelectric substrate. The surface wave propagation film is provided in the form of a diamond-like carbon or aluminum nitride film.

In accordance with the first aspect, an interlayer is provided between the piezoelectric substrate and the surface wave propagation film, or the diamond-like carbon film has a concentration gradient of hydrogen in its thickness direction so that the hydrogen concentration is relatively lower in its thickness portion closer to the piezoelectric substrate and is relatively higher in its thickness portion remoter from the piezoelectric substrate.

In accordance with a second aspect of the present invention, a surface acoustic wave device is provided which includes a substrate, a surface wave propagation film disposed upon the substrate, a piezoelectric film disposed upon the surface wave propagation film and electrodes for applying an electric field in the piezoelectric film. The surface wave propagation film is provided in the form of a diamond-like carbon or aluminum nitride film.

In accordance with the second aspect, an interlayer is provided between the substrate and the surface wave propagation film, or the diamond-like carbon film has a concentration gradient of hydrogen in its thickness direction so that the hydrogen concentration is relatively lower in its thickness portion closer to the piezoelectric film and is relatively higher in its thickness portion remoter from the piezoelectric film.

The surface acoustic wave device in accordance with the present invention employs the diamond-like carbon or aluminum nitride film as the surface wave propagation film so that a thin-film formation thereof can be performed at a lower temperature relative to the above-described, conventional diamond thin-film formation. Accordingly, the thin-film formation produces a reduced degree of internal stress relative to the conventional diamond film formation to result in the formation of the surface wave propagation film which exhibits good adherence to the underlying layer. Also, the device can be operated at higher frequencies since the diamond-like carbon or aluminum nitride film allows high-speed propagation of acoustic waves therethrough. The provision of such a surface wave propagation film also improves corrosion resistance of the device.

As used herein, the term "diamond-like carbon film" is intended to include both amorphous and crystalline carbon films. Such carbon films can be formed such as by a CVD method employing a substrate temperature in the range from ambient(25° C.) to 400° C.

The diamond-like carbon film contains hydrogen in the hydrogen concentration generally of not lower than 0.5 atomic percent. The term "crystalline carbon film" as used in the present invention is intended to refer to the carbon film which includes a crystalline region(s).

Although the diamond-like carbon film for use in the present invention is described above as containing hydrogen, the hydrogen concentration may be uniform throughout the carbon film. Alternatively, the carbon film may have a concentration gradient of hydrogen in its thickness direction. In the latter case, it is preferred that the hydrogen concentration is relatively lower in a thickness portion of the film closer to the piezoelectric substrate or film and is relatively higher in a thickness portion of the film remoter from the piezoelectric substrate or film.

This is because the acoustic wave velocity is increased as the hydrogen concentration decreases. It is accordingly preferred that the carbon film has such a structure that acoustic waves travel at a higher velocity through a thickness portion of the carbon film closer to the piezoelectric substrate or film. It is within the knowledge of the inventors of the present application that the internal stress in the carbon film increases with reduction in hydrogen concentration and decreases with increase in hydrogen concentration therein. Accordingly, the reduction of an overall internal stress in the carbon film as well as the transmittance of acoustic waves at higher frequencies can be accomplished by selecting the carbon film structure wherein a thickness portion of the carbon film closer to the piezoelectric substrate or film contains a lower concentration of hydrogen to exhibit a higher internal stress, and wherein a thickness portion of the carbon film remoter from the piezoelectric substrate or film contains a higher concentration of hydrogen to exhibit a lower internal stress. The reduction of the overall internal stress in the carbon film further improves its adherence to the underlying layer when employed as the surface wave propagation film.

Where the diamond-like carbon film is employed as the surface wave propagation film, it is preferred that a difference in hydrogen concentration between a thickness portion of the film adjacent or closest to the piezoelectric substrate or film and a thickness portion of the film opposite to or remotest from the piezoelectric substrate or film is not lower than 10 atomic percent. Also, in the case of the amorphous diamond-like carbon film, it is preferred that the hydrogen concentration is set in the range of 10–30 atomic percent in the thickness portion of the film closest to the piezoelectric substrate or film and in the range of 40–65 atomic percent in the thickness portion of the film remotest from the piezoelectric substrate or film. It is also preferred that at least the thickness portion of the diamond-like carbon film closest to the piezoelectric substrate or film comprises crystalline carbon so that the velocity of acoustic wave passing through the thickness portion is increased. In such an event, the hydrogen concentration is set preferably in the range of 0.5–10 atomic percent in the thickness portion of the film closest to the piezoelectric substrate or film and in the range of 10–65 atomic percent in the thickness portion of the film remotest from the piezoelectric substrate or film.

In the present invention, the hydrogen concentration is given in terms of atomic percent, measurable such as by a secondary ion mass spectrometry (SIMS).

The thickness of the diamond-like carbon film for use as the surface wave propagation film in the present invention is preferably in the range of 2000 Å–2 $\mu$m. The specific resistance of the diamond-like carbon film is preferably not lower than $10^4$ $\Omega$cm, more preferably in the range of $10^9$–$10^{12}$ $\Omega$cm. The thickness of the aluminum nitride film is preferably in the range of 2000 Å–1 $\mu$m.

The piezoelectric substrate in accordance with the first aspect of the present invention is a substrate at least a surface portion of which is piezoelectric, and includes a substrate comprised in whole by piezoelectric material and a substrate having a piezoelectric film provided on a non-piezoelectric base plate.

Illustrative of the substrates comprised wholly of the piezoelectric material are those substrates comprised of single crystal materials such as $LiNbO_3$, $LiTaO_3$, $Bi_{12}GeO_{20}$, $Bi_{12}SiO_{20}$, AlN, and quartz, and other substrates comprised of piezoelectric ceramic materials such as PZT ($PbTiO_3$-$PbZrO_3$). The piezoelectric film provided on the non-piezoelectric base plate may be prepared from such materials as ZnO, AlN and CdS. These piezoelectric films may be formed by a CVD or sputtering technique. The thickness of the piezoelectric film is preferably in the range of 2000 Å–1 $\mu$m.

The type of the non-piezoelectric material is not particularly limited and includes such metals as Si, W, Mo, Cu, Ta, Al, Ti, and compounds containing any of those metals.

In the first and second aspects of the present invention, an interlayer may be suitably provided between the surface wave propagation film and the piezoelectric substrate or the substrate. In the second aspect, an interlayer may be suitably provided between the surface wave propagation film and the piezoelectric film. The provision of such an interlayer improves adherence of the surface wave propagation film or the piezoelectric film. Examples of interlayer materials include Si, Ti, Zr, Ge, oxides and nitrides thereof. The thickness of the interlayer is preferably in the range of 10 Å–500 Å.

When a diamond-like carbon film is provided as a surface wave propagation film in accordance with the present invention, nitrogen may be contained in the diamond-like carbon film. The content of nitrogen is preferably in the range of 5 to 54 atomic percent. To contain nitrogen in the diamond-like carbon film provides to the reduction of internal stress of the diamond-like carbon film, thereby to prevent being separated from the underlayer. When the diamond-like carbon film is in contact with a piezoelectric film of a nitride compound, the formation of chemical bonding to the piezoelectric film improves adherence to the piezoelectric film.

DESCRIPTION OF THE PREFERRED EMBODIMENTS

Figure 20:
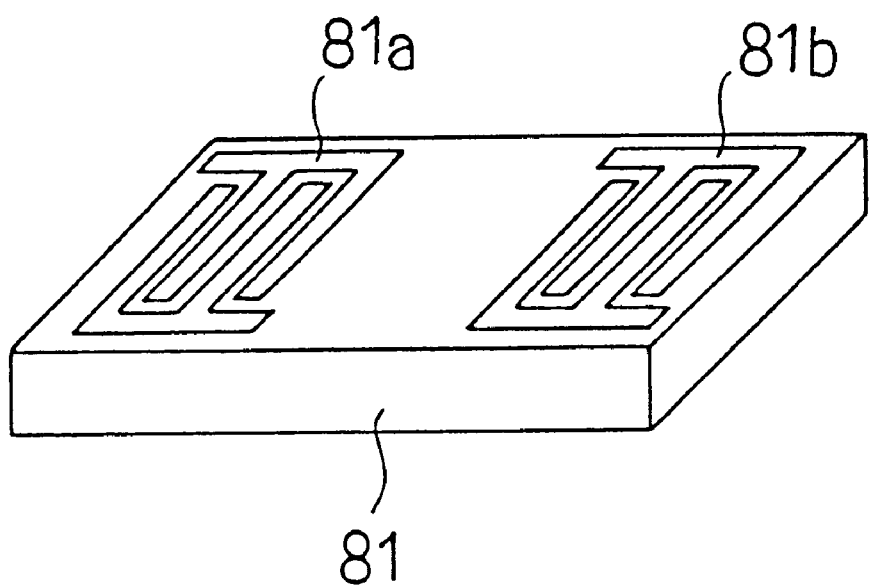
FIG. 20 is a perspective view showing a general structure of a conventional surface wave acoustic device.

FIG. 20 is a perspective view illustrating a general structure of a typical surface acoustic wave device. The device includes a pair of interdigital electrode arrays 81a, 81b placed on a piezoelectric substrate 81. Those interdigital electrode arrays 81a, 81b are generally comprised of aluminum. One of the interdigital electrode arrays produces exciting surface waves which propagate on a surface of the piezoelectric substrate 81 to be converted by another interdigital electrode array into electrical signals for output.

Figure 1:
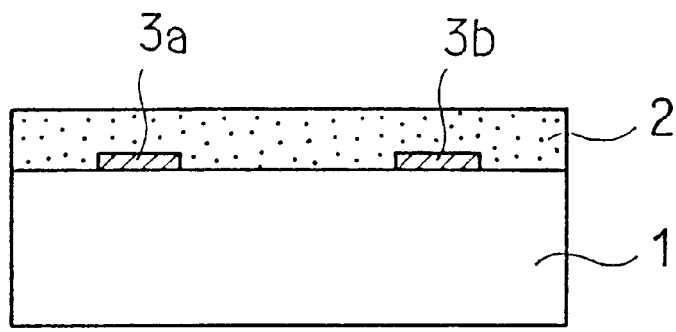
FIG. 1 is a cross-sectional view of one surface acoustic wave device embodiment in accordance with a first aspect of the present invention.

FIG. 1 is a cross-sectional view of one surface acoustic wave device embodiment in accordance with the present invention. A piezoelectric substrate 1 is a substrate such as of single crystal piezoelectric material or piezoelectric ceramic. Disposed upon the piezoelectric substrate 1 are a pair of interdigital electrode arrays 3a, 3b and a diamond-like carbon film 2.

The diamond-like carbon film 2 may be formed such as by a ECR plasma CVD apparatus as will be described hereinafter. The interdigital electrode arrays 3a, 3b can be made from a deposited aluminum film which has been etched to desirable patterns such as by photolithographic techniques. In this embodiment, the thickness of the diamond-like carbon film is about 4000 Å.

Figure 2:
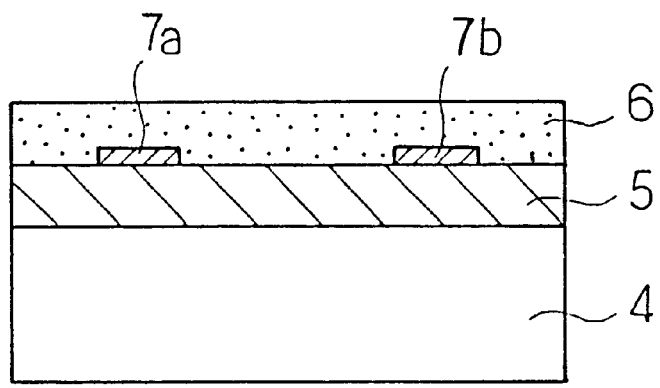
FIG. 2 is a cross-sectional view of another surface acoustic wave device embodiment in accordance with the first aspect of the present invention.

FIG. 2 is a cross-sectional view of another surface acoustic wave device embodiment in accordance with the first aspect of the present invention. Disposed upon a non-piezoelectric base plate 4 is a piezoelectric film 5. In this embodiment, the non-piezoelectric base plate 4 is comprised of silicon and the piezoelectric film is formed of ZnO to a thickness of 5000 Å.

Interdigital electrode arrays 7a, 7b are disposed on the piezoelectric film 5. Disposed upon the interdigital electrode arrays 7a, 7b and the piezoelectric film 5 is a diamond-like carbon film 6 as analogously to the device construction of FIG. 1.

Figure 3:
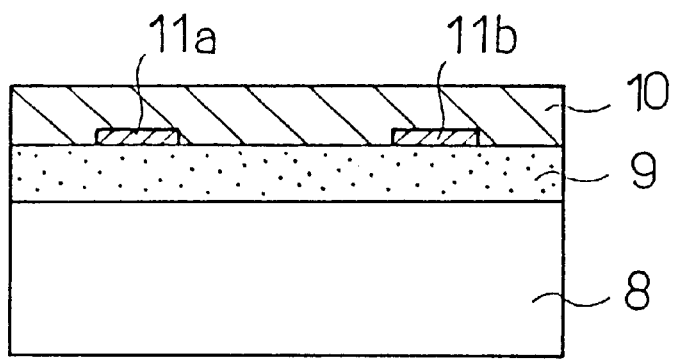
FIG. 3 is a cross-sectional view of one surface acoustic wave device embodiment in accordance with a second aspect of the present invention.

FIG. 3 is a cross-sectional view of one surface acoustic wave device embodiment in accordance with the second aspect of the present invention. Disposed on a substrate 8 is a diamond-like carbon film 9. In this particular embodiment, the substrate 8 is comprised of silicon and the diamond-like carbon film is formed to a thickness of about 4000 Å. Placed upon the diamond-like carbon film 9 are interdigital electrode arrays 11a, 11b. A piezoelectric film 10 is provided upon the diamond-like carbon film 9 and interdigital electrode arrays 11a, 11b. In this embodiment, employed as the piezoelectric film 10 is a ZnO film (5000 Å thick).

In each embodiment shown in FIGS. 1 to 3, the diamond-like carbon film has a concentration gradient of hydrogen in its thickness direction so that the hydrogen concentration is relatively lower in its thickness portion closer to the piezoelectric substrate or the piezoelectric film and is relatively higher in its thickness portion remoter from the piezoelectric substrate or the piezoelectric film.

Figure 4:
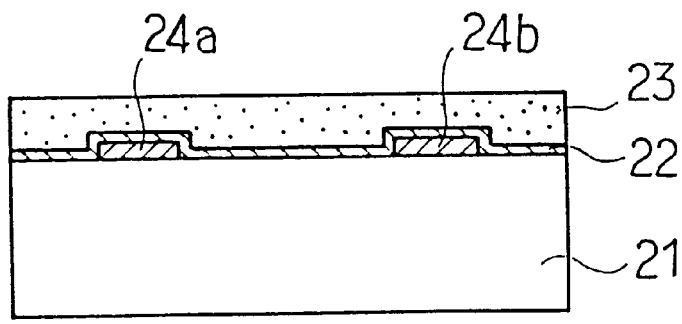
FIG. 4 is a cross-sectional view of still another surface acoustic wave device embodiment in accordance with the first aspect of the present invention.

FIG. 4 is a cross-sectional view of still another surface acoustic wave device embodiment in accordance with the first aspect of the present invention. Disposed upon a piezoelectric substrate 21 are interdigital electrode arrays 24a, 24b. Placed upon the piezoelectric substrate 21 and the interdigital electrode arrays 24a, 24b is an interlayer 22 upon which a diamond-like carbon film 23 is mounted. In this particular embodiment, a SiO$_2$ or Si film (50 Å thick) is formed as the interlayer 22. The piezoelectric substrate 21 and the diamond-like carbon film 23 are respectively formed in the same manner as in the embodiment described with reference to FIG. 1.

Figure 5:
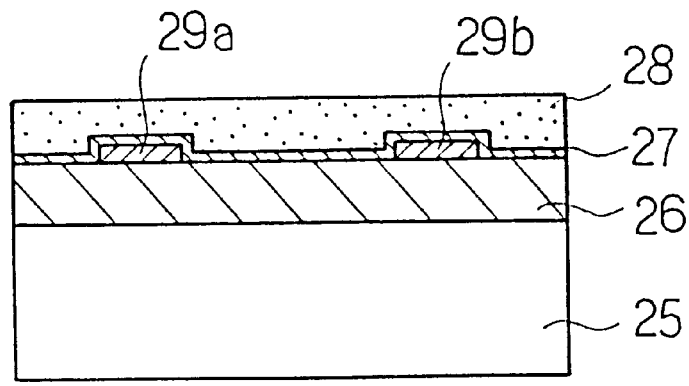
FIG. 5 is a cross-sectional view of still another surface acoustic wave device embodiment in accordance with the first aspect of the present invention.

FIG. 5 is a cross-sectional view of still another surface acoustic wave device embodiment in accordance with the first aspect of the present invention. Disposed upon a non-piezoelectric base plate 25 is a piezoelectric film 26 upon which interdigital electrode arrays 29a, 29b are mounted. Placed upon the piezoelectric film 26 and the interdigital electrode arrays 29a, 29b is an interlayer 27.

In this particular embodiment, a SiO$_2$ film (50 Å thick) is formed to constitute the interlayer 27 upon which a diamond-like carbon film 28 is provided. The non-piezoelectric base plate 25, the piezoelectric film 26 and the diamond-like carbon film 28 are respectively formed in the same manner as in the embodiment described with reference to FIG. 2.

Figure 6:
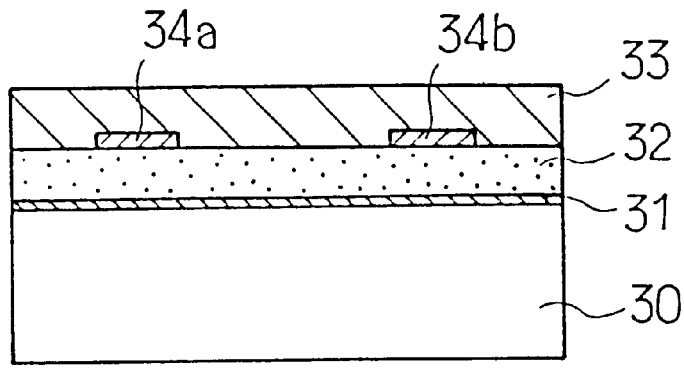
FIG. 6 is a cross-sectional view of another surface acoustic wave device embodiment in accordance with the second aspect of the present invention.

FIG. 6 is a cross-sectional view of another surface acoustic wave device embodiment in accordance with the second aspect of the present invention. Disposed on a substrate 30 is an interlayer 31. In this particular embodiment, a SiO$_2$ film (50 Å thick) is formed to constitute the interlayer 31 upon which a diamond-like carbon film 32 is provided. The diamond-like carbon film 32 carries interdigital electrode arrays 34a, 34b thereupon.

Placed upon the diamond-like carbon film 32 and the interdigital electrode arrays 34a, 34b is a piezoelectric film 33. The substrate 30, the diamond-like carbon film 32 and the piezoelectric film 33 are respectively formed in the same manner as in the embodiment described with reference to FIG. 3.

In each embodiment shown in FIGS. 4 to 6, the diamond-like carbon film may or may not have a concentration gradient of hydrogen in its thickness direction. When having the concentration gradient of hydrogen, the hydrogen concentration is relatively lower in its thickness portion closer to the piezoelectric substrate or the piezoelectric film and is relatively higher in its thickness portion remoter from the piezoelectric substrate or the piezoelectric film.

Figure 7:
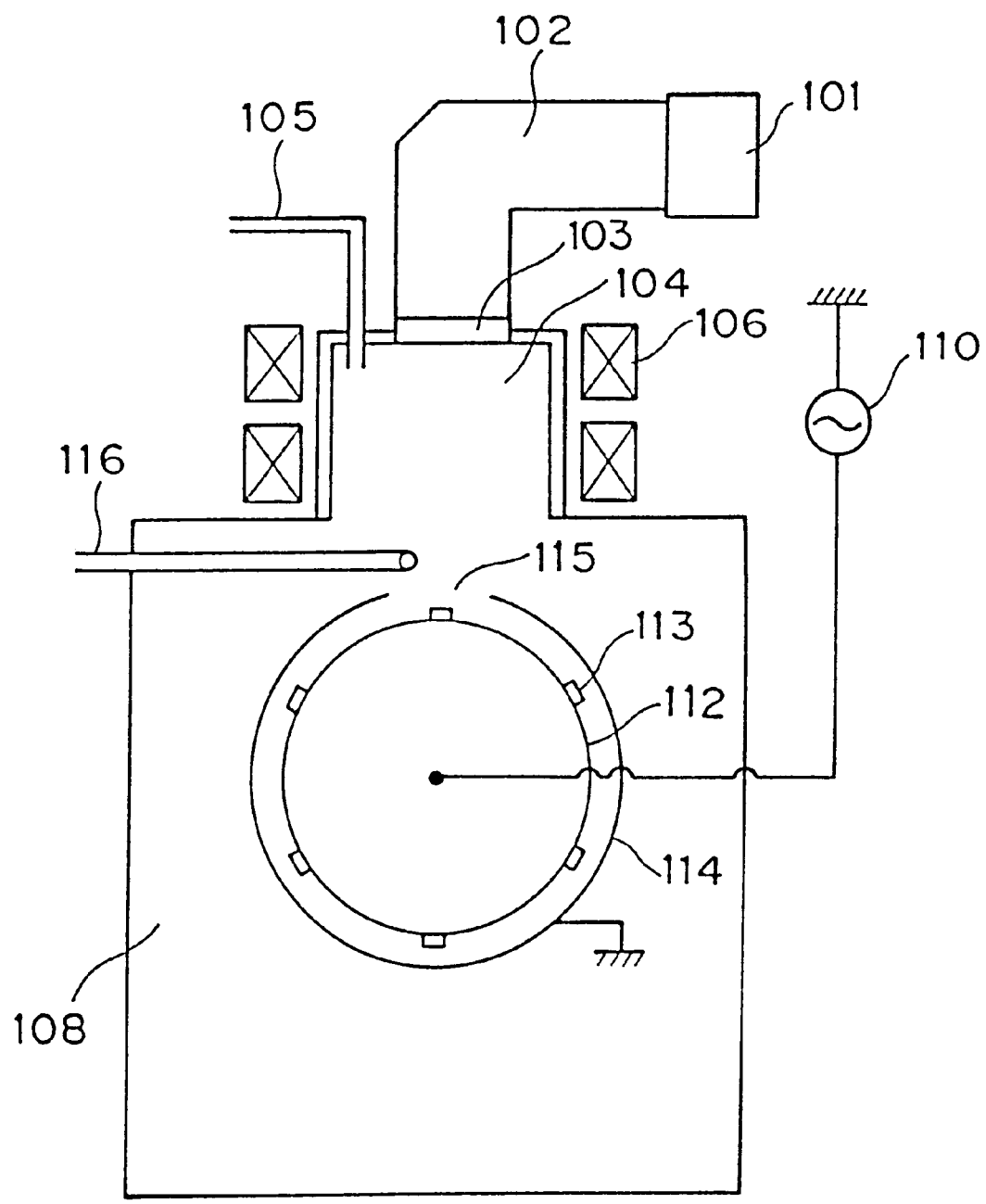
FIG. 7 is a schematic diagram showing a ECR plasma CVD apparatus.

FIG. 7 is a schematic diagram of a ECR plasma CVD apparatus for forming the diamond-like carbon film for use in the present invention. The ECR plasma CVD apparatus will be explained below.

With reference to FIG. 7, disposed interior of a vacuum chamber 108 are a plasma generation chamber 104 and a reaction chamber within which substrates 113 are positioned. One end of a waveguide 102 is connected to the plasma generation chamber 104. Another end of the waveguide 102 is mounted to a microwave supplying means 101. The microwaves generated within the microwave supplying means 101 pass through the waveguide 102 and a microwave inlet window 103 to be guided into the plasma generation chamber 104.

Connected to the plasma generation chamber 104 is a discharge gas inlet line 105 for introducing a discharge gas such as argon (Ar) into the plasma generation chamber 104. A plurality of plasma magnetic field generators 106 are mounted circumferentially of the plasma generation chamber 104.

A drum-shaped substrate holder 112 is provided within the reaction chamber in the vacuum chamber 108 so as to be rotatable about an axis which perpendicularly crosses a page surface of the drawing. A motor (not shown) is connected to the substrate holder 112. A plurality of substrates 113 (six in this embodiment) are arranged circumferentially of the substrate holder 112 at regular intervals. A high-frequency power source 110 is connected to the substrate holder 112. Also provided interior of the substrate holder 112 is a heater (not shown) for heating the substrates 113.

A hollow cylindrical shielding cover 114, made of metal, radially surrounds the substrate holder 112 to define therebetween a spacing of about 5 mm. The shielding cover 114 is connected to a grounded electrode. The shielding cover 114 functions to prevent generation of discharges between the vacuum chamber 108 and a substrate holder area excluding target film-forming locations thereon, which discharges will be otherwise generated when a radio frequency (hereinafter RF) voltage is applied to the substrate holder 112 for film-forming.

The shielding cover 114 has an opening 115. A plasma from the plasma generation chamber 104 is directed to pass through the opening 115 to impact the substrates 112 mounted on the substrate holder 112. The vacuum chamber 108 is equipped with a reaction gas inlet line 116. A leading end of the reaction gas inlet line 116 is positioned above the opening 115.

Figure 8:
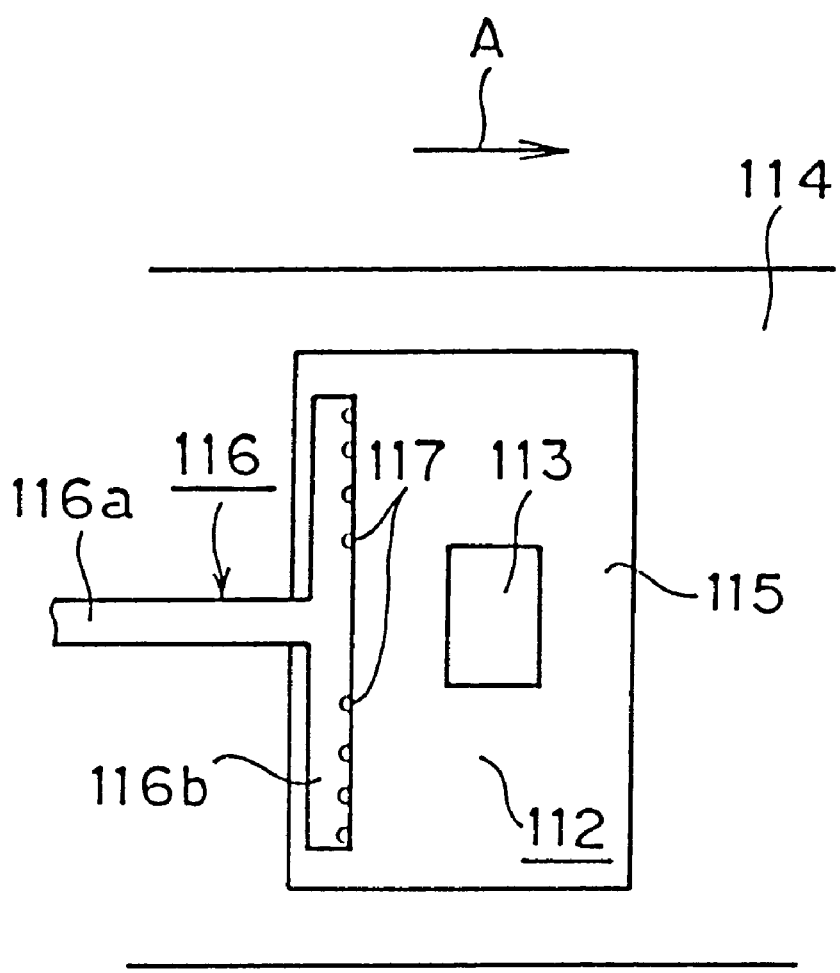
FIG. 8 is a plan view showing an opening portion of the ECR plasma CVD apparatus of FIG. 7.

FIG. 8 is a plan view showing the leading end of the reaction gas inlet line 116 and its vicinity. Referring to FIG. 8, the reaction gas inlet line 116 includes a gas inlet portion 116a for introducing a $CH_4$ gas into the vacuum chamber 108 and a gas discharge portion 116b for perpendicular connection to the gas inlet portion 116a. The gas discharge portion 116b is arranged to perpendicularly cross a direction A of rotation of the substrate holder 112 and is positioned above the opening 115. In the plan view, the gas discharge portion 116b is located upstream along the direction A within the opening 115.

The gas discharge portion 116b has a plurality of holes 117 which are directed downwardly each at an angle of about 45 degrees. In this embodiment, eight holes 117 are provided as shown in FIG. 8. These holes 117 are spaced from each other at distances which become smaller toward each end of the gas discharge portion 116b. The provision of the holes 117 at such spacings allows the $CH_4$ gas introduced from the gas inlet portion 116a to be discharged therefrom with a substantially uniform distribution along the length of the gas discharge portion 116b.

EXAMPLE 1

The aforementioned ECR plasma CVD apparatus was employed to form the diamond-like carbon film 2 of the embodiment shown in FIG. 1 in the following procedures.

The vacuum chamber 108 was first evacuated to a pressure of $10^{-5}$–$10^{-7}$ Torr. followed by rotation of the substrate holder 112 at a speed of about 10 rpm. The Ar gas at $5.7 \times 10^{-4}$ torr. was then supplied from the discharge gas inlet line 105 while a 2.45 GHz, 100 W microwave was supplied from the microwave supplying means 101, so that an Ar plasma is generated within the plasma generation chamber 104 to strike a surface of each substrate 113.

Simultaneously with the above, a $CH_4$ gas at $1.3 \times 10^{-3}$ Torr. was supplied through the reaction gas inlet line 116 while a 13.56 MHz RF power from the high-frequency power source 116 was supplied to the substrate holder 112.

Figure 9:
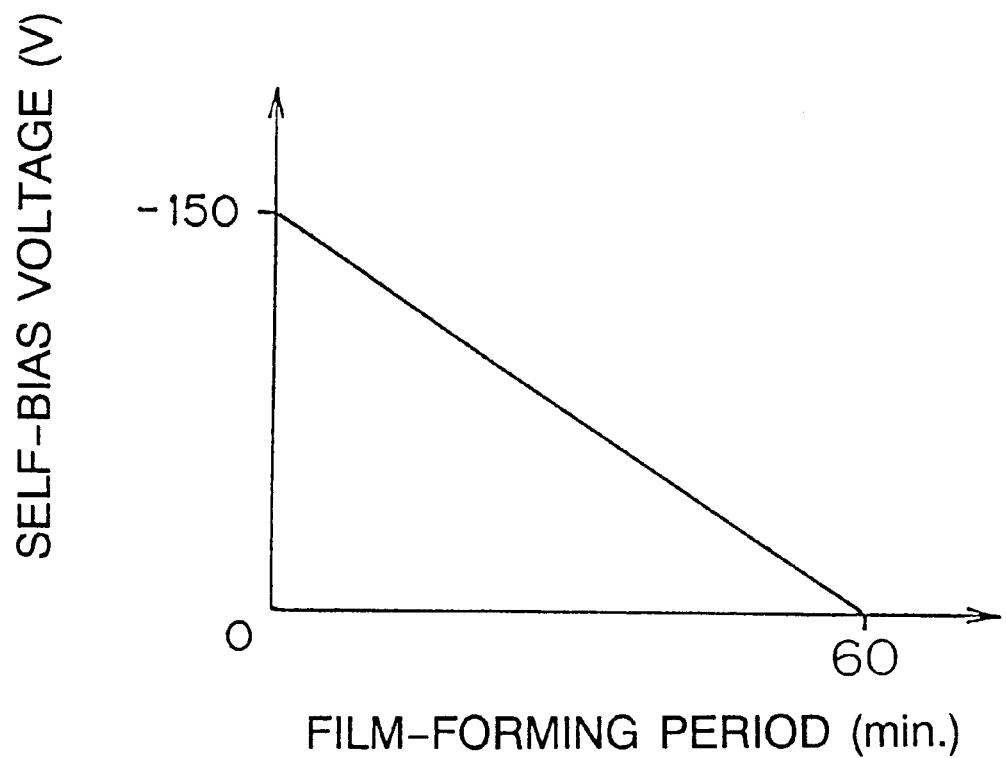
FIG. 9 is a graph showing the relation between the film-forming period and the self-bias voltage in accordance with one embodiment of the present invention.

The RF power for supply to the substrate holder 112 was varied through a range from $-150$ V at the start of the film-forming to 0 V at completion of the film-forming, as shown in FIG. 9. Here, no heating was applied to the substrates during formation of the diamond-like carbon film.

Figure 10:
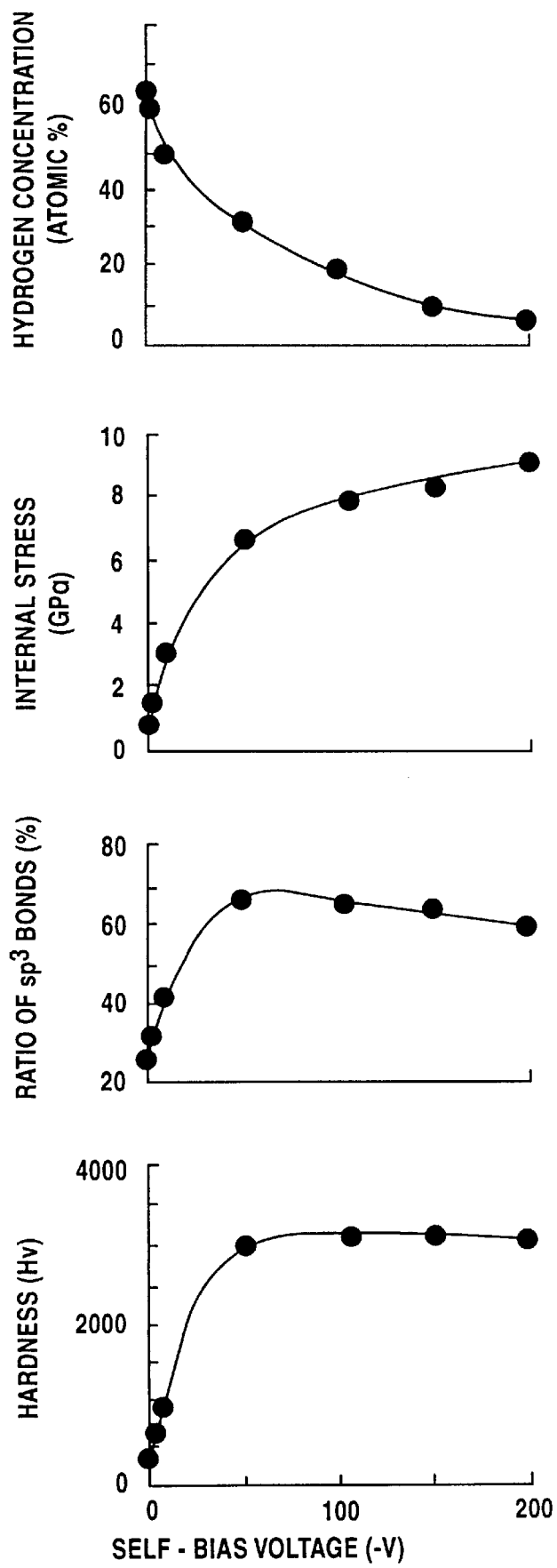
FIG. 10 is a set of graphs respectively illustrating the self-bias voltages produced in the substrate versus the hydrogen concentration in the diamond-like carbon film, versus the internal stress in the film when the thickness thereof is 1000 Å, versus the ratio of $sp^3$ C—C bonds to total C—C bonds, and versus the Vickers hardness (Hv) of the film.

FIG. 10 is a set of graphs respectively illustrating the self-bias voltages produced in the substrate versus the hydrogen concentration in the diamond-like carbon film, versus the internal stress in the film when the thickness thereof is 1000 Å, versus the ratio of $sp^3$ C—C bonds to total C—C bonds, and versus the Vickers hardness (Hv) of the film.

The aforementioned ECR plasma CVD apparatus was employed to form a diamond-like carbon film under the condition that the self-bias voltage generated in the substrates was maintained constant. The diamond-like carbon film thus obtained was measured for its various characteristics. The measured values were given in FIG. 10.

FIG. 10 further shows the relation between the self-bias voltage generated in the substrate and the ratio of $Sp^3$ C—C bonds to total C—C bonds in the diamond-like carbon film formed at respective self-bias voltages. The above-mentioned ECR plasma CVD apparatus was employed to form a diamond-like carbon film under the condition that the self-bias voltage generated in the substrate was maintained constant. The diamond-like carbon film thus obtained was measured for values determined by the ratio of $sp^3$ C—C bonds to total C—C bonds.

As apparent from FIG. 10, in the self-bias voltage range from 0 V to $-200$ V, the proportions of $Sp^3$ C—C bonds in the resulting diamond-like carbon films are not lower than 25%.

Also, the specific resistance measurement of the diamond-like carbon films formed according to the above-described film-forming conditions revealed $10^9$–$10^{12}$ Ωcm. A series of experiments was made to confirm that no short-circuit was caused in the surface acoustic device components such as electrodes.

Another series of experiments was made to confirm that the diamond-like carbon films were formed according to the above-described film-forming conditions at temperatures not exceeding 100° C.

As can be seen from FIG. 10, the self-bias voltage of 0 V results in the formation of a diamond-like carbon film having a hardness of about 850 Hv, an internal stress of about 0.8 GPa, and a hydrogen concentration of about 65 atomic percent. On the other hand, the self-bias voltage of $-150$ V results in the formation of a diamond-like carbon film having a hardness of about 3200 Hv, an internal stress of about 8 GPa, and a hydrogen concentration of about 10 atomic percent.

This teaches that the acoustic wave travels at a higher velocity through the diamond-like carbon film formed with the use of higher self-bias voltages and at a lower velocity through the diamond-like carbon film formed with the use of lower self-bias voltages. FIG. 9 shows one particular step to be taken when forming a diamond-like carbon film wherein the self-bias voltage is changed with time from $-150$ V to 0 V. By using such a step, a diamond-like carbon film can be obtained which has a property gradient in its thickness direction. That is, the resulting diamond-like carbon film has a thickness portion having a higher internal stress to allow the propagation therethrough of acoustic waves at higher velocities and another thickness portion having a lower internal stress to allow the propagation therethrough of acoustic waves at lower velocities.

Accordingly, a diamond-like carbon film can be formed which has a thickness portion adjacent or closer to the piezoelectric substrate through which acoustic wave travels at a high velocity and which is low in its overall internal stress. Such a diamond-like carbon film also exhibits improved adherence.

Figure 11:
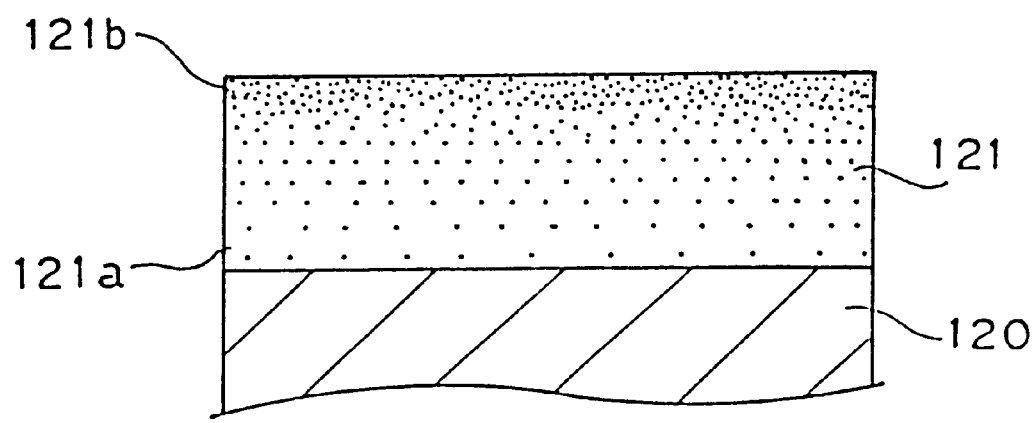
FIG. 11 is a cross-sectional view of one diamond-like carbon film embodiment having a non-stepwise concentration gradient of hydrogen in its thickness direction in accordance with the present invention.

A diamond-like carbon film 121 as shown in FIG. 11 can be obtained by using the above-described film-forming step wherein the self-bias voltage is changed with time. The illustrated diamond-like carbon film 121 is formed upon an underlying layer 120. A thickness portion 121*a* of the film 121 adjacent or closest to the underlying layer 120 has a higher internal stress to allow the acoustic wave to propagate therethrough at a higher velocity. A thickness portion 121*b* of the film 121 opposite to or remotest from the underlying layer 120 has a lower internal stress to allow the acoustic wave to propagate therethrough at a lower velocity.

The formation of diamond-like carbon film was practiced with varied self-bias voltages in the manner as described above. The center frequency measurement of the obtained surface acoustic wave device revealed the value 1.11 times higher than that of a control surface acoustic wave device not incorporating such a diamond-like carbon film.

EXAMPLE 2

A surface acoustic wave device as illustrated in FIG. 1 was prepared wherein a thickness portion of the diamond-like carbon film 2 closest to the piezoelectric substrate 1 was comprised of crystalline carbon and a thickness portion thereof remotest from the piezoelectric substrate 1 was comprised of amorphous carbon. A self-bias voltage was varied from −150 V to 0 V in the same manner as in the above Example 4. An Ar gas from the discharge gas inlet line was maintained at $5.7 \times 10^{-4}$ Torr. An $O_2$ gas pressure was gradually reduced from $1.4 \times 10^{-4}$ Torr. at the start of film-forming to 0 Torr. at completion of film-forming.

In addition, a diamond-like carbon film was formed under the condition that the substrate temperature was maintained at 200° C. The diamond-like carbon film thus formed included a thickness portion closest to the piezoelectric substrate 1 in the form of crystalline carbon and having a hydrogen concentration of 3 atomic percent, and a thickness portion remotest from the piezoelectric substrate 1 in the form of amorphous carbon and having a hydrogen concentration of 65 atomic percent. A surface acoustic wave device incorporating such a diamond-like carbon film revealed a center frequency 1.18 times higher than that of a control surface acoustic wave device not incorporating such a diamond-like carbon film.

EXAMPLE 3

A $SiO_2$ film (50 Å thick) was formed which constituted the interlayer 22 of the surface acoustic wave device as illustrated in FIG. 4. The $SiO_2$ film was formed by sputtering. A diamond-like carbon film 23 was formed in the same manner as the diamond-like carbon film 2 of Example 1, except that the RF power was supplied to the substrate holder so that a constant self-bias voltage of −150 V was generated in the substrate during the film formation.

The diamond-like carbon film 23 was thus formed to a thickness of 4000 Å. A hydrogen concentration of the diamond-like carbon film 23 was measured to be substantially constant in its thickness direction and to be 10 atomic percent. In addition, the diamond-like carbon film was observed to be a amorphous carbon film.

A surface acoustic wave device thus obtained revealed a center frequency 1.12 times higher than that of a control surface acoustic wave device not incorporating such a diamond-like carbon film.

An evaluation test was made on adherence of the diamond-like carbon film of the resulting surface acoustic wave device. The adherence was evaluated by an indentation test with constant load (1 kg) employing Vickers indenter. 50 samples were prepared, and the number of those causing separation of the diamond-like carbon film was counted. The number of separation for the diamond-like carbon film provided through the interlayer was 5, while the number of separation for the comparative diamond-like carbon film provided directly on the substrate was 50. Therefore, it is understood that the provision of the interlayer improves adherence of the diamond-like carbon film to the underlying layer.

EXAMPLE 4

A surface acoustic wave device as illustrated in FIG. 4 was prepared wherein a Si film was formed as constituting the interlayer 22 and the diamond-like carbon film 23 was formed in the same manner as the diamond-like carbon film 23 of Example 3 was formed. The Si film was formed by sputtering to a thickness of 50 Å. The surface acoustic wave device thus obtained revealed a center frequency 1.12 times higher than that of a control surface acoustic wave device not incorporating such a diamond-like carbon film.

An evaluation test was made on adherence of the diamond-like carbon film of the resulting surface acoustic wave device. The adherence was evaluated by an indentation test with constant load (1 kg) employing Vickers indenter. 50 samples were prepared, and the number of those causing separation of the diamond-like carbon film was counted. The number of separation for the diamond-like carbon film provided through the interlayer was 3, while the number of separation for the comparative diamond-like carbon film provided directly on the substrate was 50. Therefore, it is understood that the provision of the interlayer improves adherence of the diamond-like carbon film to the underlying layer.

EXAMPLE 5

A surface acoustic wave device as illustrated in FIG. 6 was prepared wherein a Si film serving as the interlayer 31 was formed in the same manner as the interlayer 22 was formed in Example 3. The diamond-like carbon film 32 was formed in the same manner as the diamond-like carbon film 23 was formed in Example 3. The piezoelectric film 33 which is a ZnO film was formed by sputtering. The interlayer 31 was formed to a thickness of 50 Å.

The surface acoustic wave device thus obtained revealed a center frequency 1.13 times higher than that of a control surface acoustic wave device not incorporating such a diamond-like carbon film.

In the above embodiments, the diamond-like carbon film was described as having a non-stepwise or continuous concentration gradient of hydrogen in its thickness direction, such as illustrated in FIG. 11. Alternatively, the diamond-like carbon film may have a stepwise concentration gradient of hydrogen in its thickness direction, such as illustrated in FIG. 12.

Figure 12:
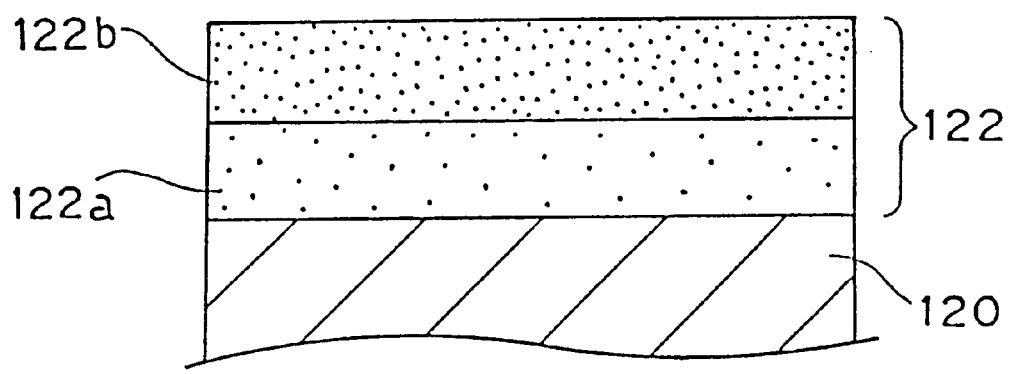
FIG. 12 is a cross-sectional view of another diamond-like carbon film embodiment having a stepwise concentration gradient of hydrogen in its thickness direction in accordance with the present invention.
Figure 13:
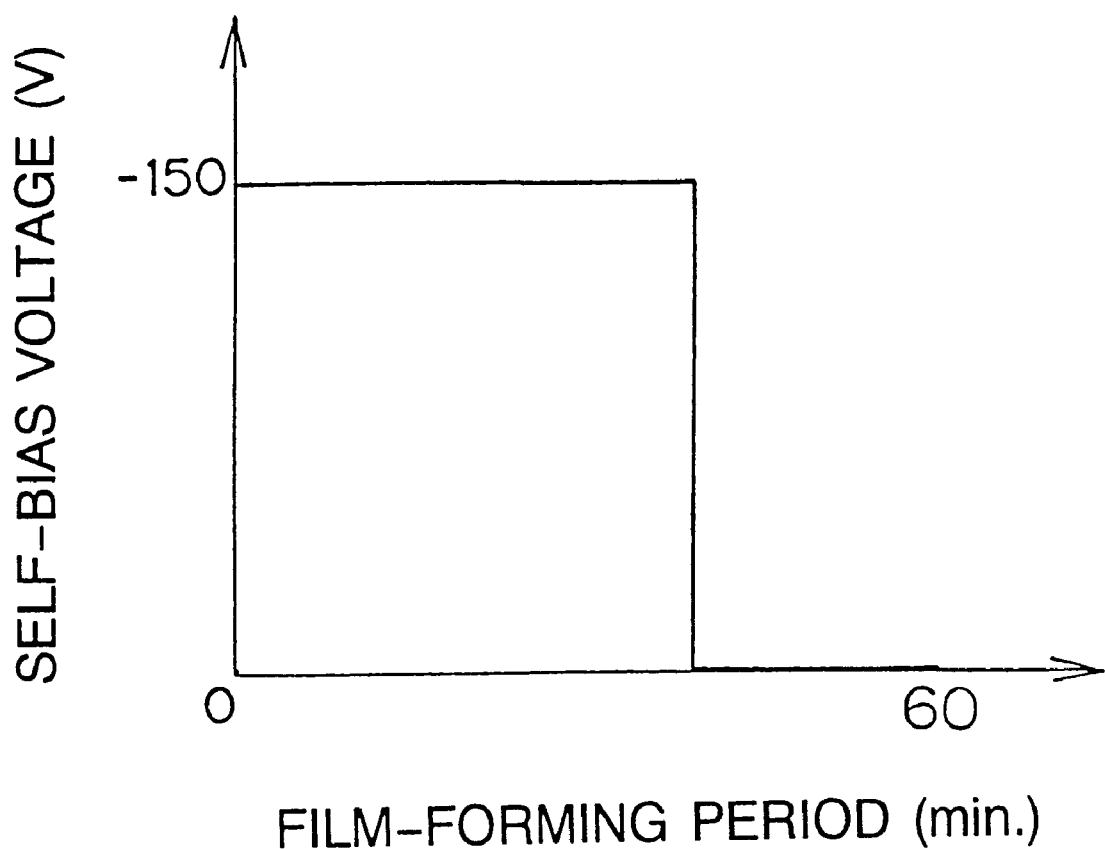
FIG. 13 is a graph showing the relation between the self-bias voltage and the film-forming period.

FIG. 12 shows a diamond-like carbon film 122 provided upon an underlying layer 120. The diamond-like carbon film 122 includes a first layer 122a having a relatively lower concentration of hydrogen, and a second layer 122b laminated onto the first layer and having a relatively higher concentration of hydrogen. Such a laminated film can be formed by changing the self-bias voltage in a step-wise manner in the course of film-forming as illustrated in FIG. 13.

Although the diamond-like carbon film is illustrated in FIG. 12 as being of a two-layer construction, the diamond-like carbon film may be of a multi-layer construction incorporating three or more layers so that a stepwise change in hydrogen concentration is defined in a thickness direction of the film.

Improved corrosion resistance imparted by the diamond-like carbon film

A sample was prepared which had a diamond-like carbon film on an aluminum substrate for comparison with a control sample only of the aluminum substrate. The diamond-like carbon film was formed under the same condition as employed in Example 1. These samples were placed under a 65° C. and 90% RH atmosphere. In about 50 hours, corrosion was observed to be caused on a surface of the aluminum substrate of the control sample. In contrast, no corrosion was observed on the sample incorporating the diamond-like carbon film. These results demonstrate that the provision of the diamond-like carbon film in accordance with the present invention is effective in preventing corrosion of aluminum interdigital electrode arrays to impart improved corrosion resistance.

Figure 14:
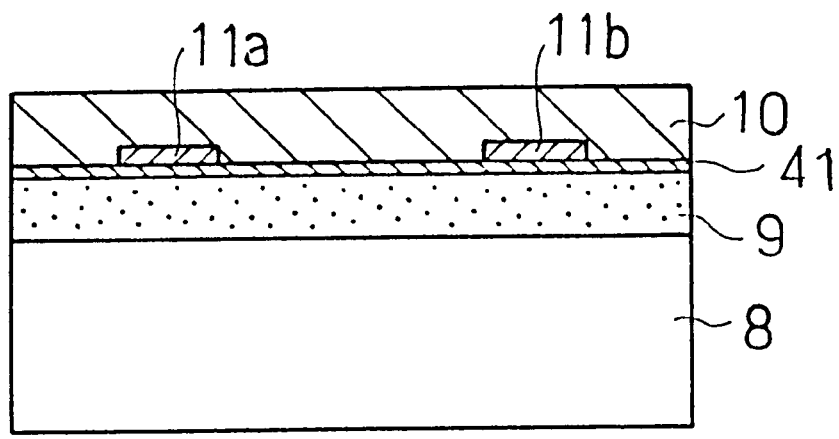
FIG. 14 is a cross-sectional view of still another surface acoustic wave device embodiment in accordance with the second aspect of the present invention.

FIG. 14 is a cross-sectional view illustrating a still another surface acoustic wave device embodiment in accordance with the second aspect of the present invention. In the present embodiment, an interlayer 41 is provided between the diamond-like carbon film 9 and the piezoelectric film 10 in the embodiment shown in FIG. 3. A $SiO_2$ or Si film (50 Å thick) is formed as the interlayer 41. The provision of the interlayer 41 improves adherence between the diamond-like carbon film 9 and the piezoelectric film 10.

Figure 15:
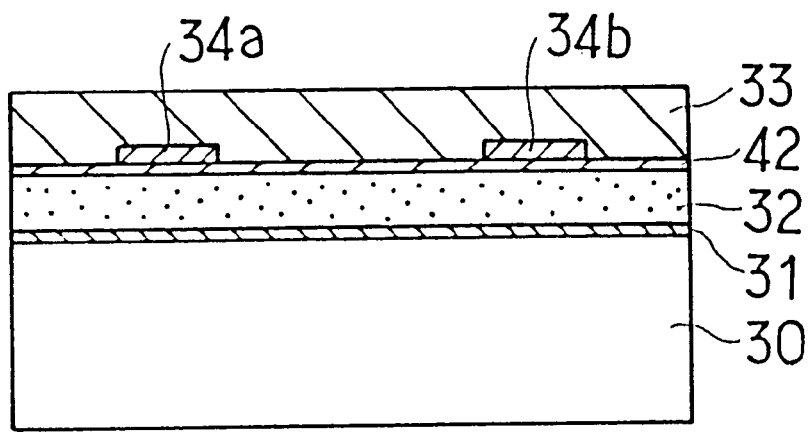
FIG. 15 is a cross-sectional view of still another surface acoustic wave device embodiment in accordance with the second aspect of the present invention.

FIG. 15 is a cross-sectional view illustrating a still another surface acoustic wave device embodiment in accordance with the second aspect of the present invention. In the present embodiment, an interlayer 42 is provided between the diamond-like carbon film 32 and the piezoelectric film 33 in the embodiment shown in FIG. 6. A $SiO_2$ or Si film (50 Å thick) is formed as the interlayer 42. The provision of the interlayer 42 improves adherence between the diamond-like carbon film 32 and the piezoelectric film 33.

Figure 16:
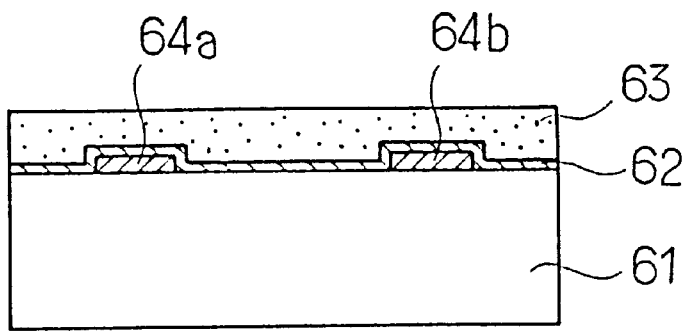
FIG. 16 is a cross-sectional view of still another surface acoustic wave device embodiment in accordance with the first aspect of the present invention.

FIG. 16 is a cross-sectional view illustrating a still another surface acoustic wave device embodiment in accordance with the first aspect of the present invention. Provided upon a piezoelectric substrate 61 are interdigital electrode arrays 64a, 64b. Provided upon the piezoelectric substrate 61 and the interdigital electrode arrays 64a, 64b is an interlayer 62 upon which an aluminum nitride film is mounted. In this embodiment, a Si or $SiO_2$ film as constituting the interlayer 62 is formed to a thickness of 50 Å. The interlayer 62 may be formed in the same manner as employed in forming the interlayer 22 of FIG. 4.

The aluminum nitride film 63 can be formed by a sputtering or CVD method. The piezoelectric substrate 61 may be of the same type of the piezoelectric substrate 1 shown in FIG. 1.

Figure 17:
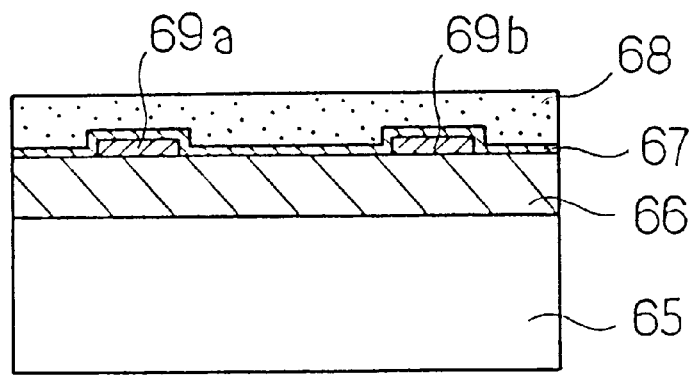
FIG. 17 is a cross-sectional view of still another surface acoustic wave device embodiment in accordance with the first aspect of the present invention.

FIG. 17 is a cross-sectional view illustrating a still another surface acoustic wave device embodiment in accordance with the first aspect of the present invention. Provided upon a non-piezoelectric base plate 65 is a piezoelectric film 66 upon which interdigital electrode arrays 69a, 69b are mounted. Provided upon the piezoelectric film 66 and the interdigital electrode arrays 69a, 69b is an interlayer 67 upon which an aluminum nitride film 68 is mounted. The interlayer 67 may be of the same type as used for the interlayer 62 of the embodiment shown in FIG. 16. The non-piezoelectric base plate 65 and the piezoelectric film 66 may be of the same types as respectively employed for those of the embodiment shown in FIG. 2.

Figure 18:
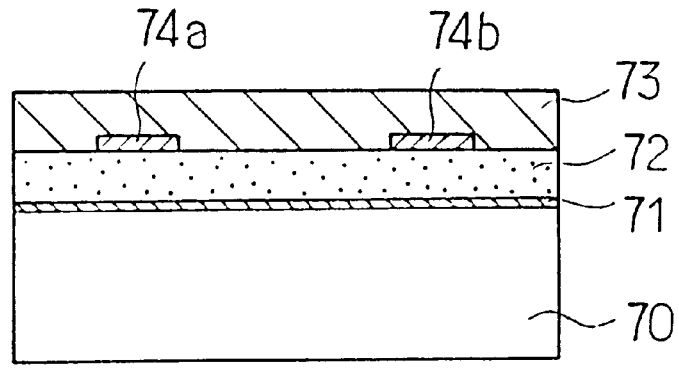
FIG. 18 is a cross-sectional view of still another surface acoustic wave device embodiment in accordance with the second aspect of the present invention.

FIG. 18 is a cross-sectional view illustrating a still another surface acoustic wave device embodiment in accordance with the second aspect of the present invention. Provided upon a substrate 70 is an interlayer 71 upon which an aluminum nitride film 72 is mounted. The aluminum nitride film 72 carries interdigital electrode arrays 74a, 74b thereon. A piezoelectric film 73 is provided upon the aluminum nitride film 72 and the interdigital electrode arrays 74a, 74b. The interlayer 71 may be of the same type as used for the interlayer 62 shown in FIG. 16. The substrate 70 and piezoelectric film 73 may be respectively of the same types as used for those of the embodiment shown in FIG. 3.

Figure 19:
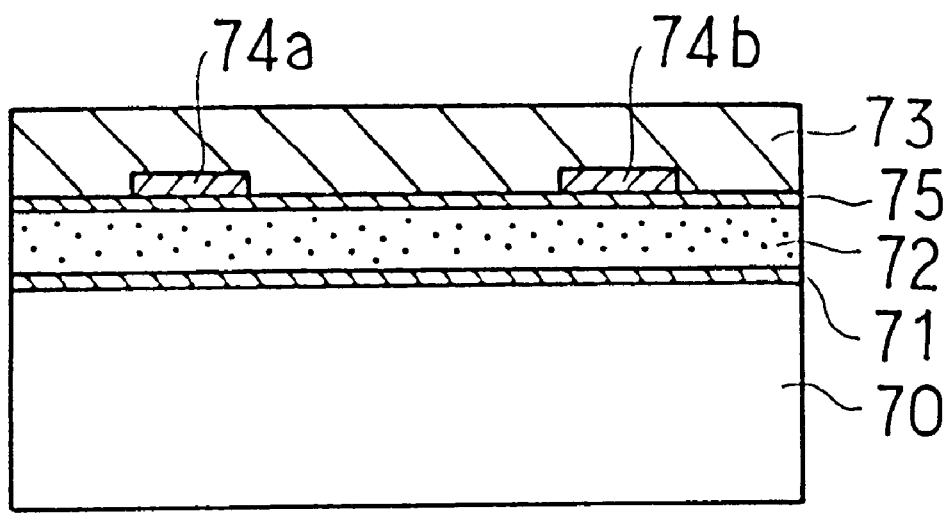
FIG. 19 is a cross-sectional view of still another surface acoustic wave device embodiment in accordance with the second aspect of the present invention.

FIG. 19 is a cross-sectional view illustrating a still another surface acoustic wave device embodiment in accordance with the second aspect of the present invention. In the present embodiment, an interlayer 75 is provided between the aluminum nitride carbon film 72 and the piezoelectric film 73 in the embodiment shown in FIG. 18. A $SiO_2$ or Si film (50 Å thick) is formed as the interlayer 75. The provision of the interlayer 75 improves adherence between the aluminum nitride carbon film 72 and the piezoelectric film 73.

EXAMPLE 6

A surface acoustic wave device of the construction shown in FIG. 16 was prepared. $LiTaO_3$ was employed for the piezoelectric substrate 61. An aluminum film was patterned to form the interdigital electrode arrays 64a, 64b. The aluminum nitride film 63 was formed by sputtering to a thickness of 4000 Å. A $SiO_2$ film was formed to a thickness of 50 Å for employment as the interlayer 62. The $SiO_2$ film was formed in the same procedure as employed in forming the interlayer 42 of the embodiment shown in FIG. 4.

The surface acoustic wave device thus obtained revealed a center frequency 1.08 times higher than that of the comparative surface acoustic wave device not incorporating the aluminum nitride film 63.

An evaluation test was made on adherence of the aluminum nitride film of the resulting surface acoustic wave device. The adherence was evaluated by an indentation test with constant load (1 kg) employing Vickers indenter. 50 samples were prepared, and the number of those causing separation of the aluminum nitride was counted. The number of separation for the aluminum nitride film provided through the interlayer was 2, while the number of separation for the comparative aluminum nitride provided directly on the substrate was 12. Therefore, it is understood that the provision of the interlayer improves adherence of the aluminum nitride film to the underlying layer.

EXAMPLE 7

A surface acoustic wave device of the construction shown in FIG. 18 was prepared. A $SiO_2$ film was formed to a thickness of 50 Å for employment as the interlayer 71. The $SiO_2$ film was formed in the same procedure as employed in Example 6 as described above. The aluminum nitride film 72 was formed in the same manner as in Example 6 above. The substrate 70 and piezoelectric film 73 were formed in the same manner as employed in Example 5.

The surface acoustic wave device obtained revealed a high center frequency value comparable to that of the device of Example 6.

Improved corrosion resistance imparted by the aluminum nitride film

A sample was prepared which carried an aluminum nitride film on an aluminum substrate for comparison with a control sample only of the aluminum substrate. These samples were placed under a 65° C. and 90% RH atmosphere. In about 50 hours, corrosion was observed to be caused on a surface of the aluminum substrate of the control sample not incorporating the aluminum nitride film. In contrast, no corrosion was observed on the sample incorporating the aluminum nitride film.

These results demonstrate that the provision of the aluminum nitride film is effective in preventing corrosion of aluminum electrodes to impart improved corrosion resistance.

Improvement of adherence by nitrogen containing in the diamond-like carbon film

In the surface acoustic wave device having the structure shown in FIG. 6, the diamond-like carbon film 32 containing 20 atomic percent of nitrogen was formed by depositing the diamond-like carbon film 32 in the atmosphere of nitrogen. The piezoelectric film 33, AlN film (1.0 μm thick) was formed by sputtering. The interlayer 31 was formed in the same manner as Example 5.

An evaluation test was made on adherence to the piezoelectric film of the resulting surface acoustic wave device. The adherence was evaluated by an indentation test with constant load (1 kg) employing Vickers indenter. 50 samples were prepared, and the number of those causing separation of the piezoelectric film was counted. The number of separation for the diamond-like carbon film containing nitrogen was 3, while the number of separation for the diamond-like carbon film not containing nitrogen was 7. Therefore, it is understood that adherence to a piezoelectric film of nitride is improved by containing nitrogen in the diamond-like carbon film.

What is claimed is:

1. A surface acoustic wave device comprising:
   a piezoelectric layer;
   a surface wave propagation film disposed upon said piezoelectric layer and comprising a diamond-like carbon film;
   electrodes for applying an electric field in said piezoelectric layer; and
   an interlayer provided between said piezoelectric layer and said surface wave propagation film, wherein said interlayer comprises at least one material selected from the group consisting of Si, Ti, Zr, Ge, oxides and nitrides thereof.

2. The surface acoustic wave device of claim 1, wherein said diamond-like carbon film has a concentration gradient of hydrogen in its thickness direction so that the hydrogen concentration is relatively lower in its thickness portion closer to the piezoelectric layer and is relatively higher in its thickness portion remoter from the piezoelectric layer.

3. The surface acoustic wave device of claim 2, wherein a difference in hydrogen concentration between a thickness portion of said diamond-like carbon film closest to the piezoelectric layer and a thickness portion thereof remotest from the piezoelectric layer is not lower than 10 atomic percent.

4. The surface acoustic wave device of claim 2, wherein the hydrogen concentration ranges 10–30 atomic percent in a thickness portion of said diamond-like carbon film closest to the piezoelectric layer and 40–65 atomic percent in a thickness portion thereof remotest from the piezoelectric layer.

5. The surface acoustic wave device of claim 2, wherein at least a thickness portion of the diamond-like carbon film closest to the piezoelectric layer comprises crystalline carbon, and wherein the hydrogen concentration ranges 0.5–10 atomic percent in the thickness portion of said diamond-like carbon film closest to the piezoelectric layer and 10–65 atomic percent in the thickness portion thereof remotest from the piezoelectric layer.

6. The surface acoustic wave device of claim 1, wherein said diamond-like carbon film has a specific resistance of $10^9$–$10^{12}$ Ωcm.

7. The surface acoustic wave device of claim 1, wherein carbon-carbon bonds in the diamond-like carbon film include at least 25% of $sp^3$ bonds.

8. The surface acoustic wave device of claim 1, wherein said diamond-like carbon film contains nitrogen.

9. The surface acoustic wave device of claim 1, wherein said piezoelectric layer comprises a piezoelectric film provided on a non-piezoelectric substrate.

10. A surface acoustic wave device comprising:
    a piezoelectric layer;
    a surface wave propagation film disposed upon said piezoelectric layer and comprising an aluminum nitride film;
    electrodes for applying an electric field in said piezoelectric layer; and
    an interlayer provided between said piezoelectric layer and said surface wave propagation film, wherein said interlayer comprises at least one material selected from the group consisting of Si, Ti, Zr, Ge, oxides and nitrides thereof.

11. The surface acoustic wave device of claim 10, wherein said piezoelectric layer comprises a piezoelectric film provided on a non-piezoelectric substrate.

12. A surface acoustic wave device comprising:
    a piezoelectric substrate;
    a surface wave propagation film disposed upon said piezoelectric substrate and comprising a diamond-like carbon film;
    electrodes for applying an electric field in said piezoelectric substrate; and
    said diamond-like carbon film having a concentration gradient of hydrogen in its thickness direction so that the hydrogen concentration is relatively lower in its thickness portion closer to the piezoelectric substrate and is relatively higher in its thickness portion remoter from the piezoelectric substrate.

13. The surface acoustic wave device of claim 12, wherein a difference in hydrogen concentration between the thickness portion of said diamond-like carbon film closest to the piezoelectric substrate and the thickness portion thereof remotest from the piezoelectric substrate is not lower than 10 atomic percent.

14. The surface acoustic wave device of claim 12, wherein the hydrogen concentration ranges 10–30 atomic percent in the thickness portion of said diamond-like carbon film closest to the piezoelectric substrate and 40–65 atomic percent in the thickness portion thereof remotest from the piezoelectric substrate.

15. The surface acoustic wave device of claim 12, wherein at least said thickness portion of the diamond-like carbon film closest to the piezoelectric substrate comprises crystalline carbon, and wherein the hydrogen concentration ranges 0.5–10 atomic percent in the thickness portion of said diamond-like carbon film closest to the piezoelectric substrate and 10–65 atomic percent in the thickness portion thereof remotest from the piezoelectric substrate.

16. The surface acoustic wave device of claim 12, wherein said diamond-like carbon film has a specific resistance of $10^9$–$10^{12}$ Ωcm.

17. The surface acoustic wave device of claim 12, wherein carbon-carbon bonds in the diamond-like carbon film include at least 25% of $sp^3$ bonds.

18. The surface acoustic wave device of claim 12, wherein said diamond-like carbon film contains nitrogen.

19. The surface acoustic wave device of claim 12, wherein said piezoelectric substrate comprises a piezoelectric film provided on a non-piezoelectric substrate.

20. The surface acoustic wave device of claim 12, wherein an interlayer is provided between the piezoelectric substrate and the surface wave propagation film.

21. A surface acoustic wave device comprising:
a substrate;
a surface wave propagation film disposed upon said substrate and comprising a diamond-like carbon film;
a piezoelectric film disposed upon said surface wave propagation film;
electrodes for applying an electric field in said piezoelectric film; and
an interlayer provided between said substrate and said surface wave propagation film wherein said interlayer comprises at least one material selected from the group consisting of Si, Ti, Zr, Ge, oxides and nitrides thereof.

22. The surface acoustic wave device of claim 21, wherein said diamond-like carbon film has a concentration gradient of hydrogen in its thickness direction so that the hydrogen concentration is relatively lower in its thickness portion closer to the piezoelectric film and is relatively higher in its thickness portion remoter from the piezoelectric film.

23. The surface acoustic wave device of claim 22, wherein a difference in hydrogen concentration between a thickness portion of said diamond-like carbon film closest to the piezoelectric film and a thickness portion thereof remotest from the piezoelectric film is not lower than 10 atomic percent.

24. The surface acoustic wave device of claim 22, wherein the hydrogen concentration ranges 10–30 atomic percent in the thickness portion of said diamond-like carbon film closest to the piezoelectric film and 40–65 atomic percent in the thickness portion thereof remotest from the piezoelectric film.

25. The surface acoustic wave device of claim 22, wherein at least said thickness portion of the diamond-like carbon film closest to the piezoelectric film comprises crystalline carbon, and wherein the hydrogen concentration ranges 0.5–10 atomic percent in the thickness portion of said diamond-like carbon film closest to the piezoelectric film and 10–65 atomic percent in the thickness portion thereof remotest from the piezoelectric film.

26. The surface acoustic wave device of claim 21, wherein said diamond-like carbon film has a specific resistance of $10^9$–$10^{12}$ Ωcm.

27. The surface acoustic wave device of claim 21, wherein carbon-carbon bonds in the diamond-like carbon film include at least 25% of $sp^3$ bonds.

28. The surface acoustic wave device of claim 21, wherein said diamond-like carbon film contains nitrogen.

29. The surface acoustic wave device of claim 21, wherein an interlayer is provided between the surface wave propagation film and the piezoelectric film.

30. A surface acoustic wave device comprising:
a substrate;
a surface wave propagation film disposed upon said substrate and comprising an aluminum nitride film;
a piezoelectric film disposed upon said surface wave propagation film;
electrodes for applying an electric field in said piezoelectric film; and
an interlayer provided between said substrate and said surface wave propagation film, wherein said interlayer comprises at least one material selected from the group consisting of Si, Ti, Zr, Ge, oxides and nitrides thereof.

31. The surface acoustic wave device of claim 30, wherein a second interlayer is provided between the surface wave propagation film and the piezoelectric film.

32. A surface acoustic wave device comprising:
a substrate;
a surface wave propagation film disposed upon said substrate and comprising a diamond-like carbon film;
a piezoelectric film disposed upon said surface wave propagation film;
electrodes for applying an electric field in said piezoelectric film; and
said diamond-like carbon film having a concentration gradient of hydrogen in its thickness direction so that the hydrogen concentration is relatively lower in its thickness portion closer to the piezoelectric film and is relatively higher in its thickness portion remoter from the piezoelectric film.

33. The surface acoustic wave device of claim 32, wherein a difference in hydrogen concentration between the thickness portion of said diamond-like carbon film closest to the piezoelectric film and the thickness portion thereof remotest from the piezoelectric film is not lower than 10 atomic percent.

34. The surface acoustic wave device of claim 32, wherein the hydrogen concentration ranges 10–30 atomic percent in the thickness portion of said diamond-like carbon film closest to the piezoelectric film and 40–65 atomic percent in the thickness portion thereof remotest from the piezoelectric film.

35. The surface acoustic wave device of claim 32, wherein at least said thickness portion of the diamond-like carbon film closest to the piezoelectric film comprises crystalline carbon, and wherein the hydrogen concentration ranges 0.5–10 atomic percent in the thickness portion of said diamond-like carbon film closest to the piezoelectric film and 10–65 atomic percent in the thickness portion thereof remotest from the piezoelectric film.

36. The surface acoustic wave device of claim 32, wherein said diamond-like carbon film has a specific resistance of $10^9$–$10^{12}$ Ωcm.

37. The surface acoustic wave device of claim 32, wherein carbon-carbon bonds in the diamond-like carbon film include at least 25% of $sp^3$ bonds.

38. The surface acoustic wave device of claim 32, wherein said diamond-like carbon film contains nitrogen.

39. The surface acoustic wave device of claim 32, wherein an interlayer is provided between the substrate and the surface wave propagation film.

40. The surface acoustic wave device of claim 32, wherein a second interlayer is provided between the surface wave propagation film and the piezoelectric film.

41. The surface acoustic wave device of claim 31, wherein second interlayer comprises at least one material selected from the group consisting of Si, Ti, Zr, Ge, oxides and nitrides thereof.

42. The surface acoustic wave device of claim 39, wherein said interlayer comprises at least one material selected from the group consisting of Si, Ti, Zr, Ge, oxides and nitrides thereof.

43. The surface acoustic wave device of claim 40, wherein second interlayer comprises at least one material selected from the group consisting of Si, Ti, Zr, Ge, oxides and nitrides thereof.

44. A surface acoustic wave device comprising:

a piezoelectric layer;

a surface wave propagation film disposed upon said piezoelectric layer and comprising a diamond-like carbon film;

electrodes for applying an electric field in said piezoelectric layer; and an interlayer provided between said piezoelectric layer and said surface wave propagation film, wherein carbon-carbon bonds in the diamond-like carbon film include at least 25% of $sp^3$ bonds.

45. The surface acoustic device comprising:

a substrate;

a surface wave propagation film disposed upon said substrate and comprising a diamond-like carbon film;

a piezoelectric film disposed upon said surface wave propagation film;

electrodes for applying an electric field in said piezoelectric film; and an interlayer provided between said substrate and said surface wave propagation film, wherein carbon-carbon bonds in the diamond-like carbon film include at least 25% of $sp^3$ bonds.

46. The surface acoustic wave device of claim 20, wherein said interlayer comprises at least one material selected from the group consisting of Si, Ti, Zr, Ge, oxides and nitrides thereof.

* * * * *